US012568719B2

(12) United States Patent
Yakabe et al.

(10) Patent No.: US 12,568,719 B2
(45) Date of Patent: Mar. 3, 2026

(54) DISPLAY DEVICE AND METHOD OF MANUFACTURING DISPLAY DEVICE

(71) Applicant: JVCKENWOOD Corporation, Yokohama (JP)

(72) Inventors: Toshiyuki Yakabe, Yokohama (JP); Noriaki Enomoto, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 446 days.

(21) Appl. No.: 18/125,956

(22) Filed: Mar. 24, 2023

(65) Prior Publication Data

US 2023/0307585 A1 Sep. 28, 2023

(30) Foreign Application Priority Data

Mar. 25, 2022 (JP) ................................. 2022-049814

(51) Int. Cl.
| | |
|---|---|
| *G09F 13/08* | (2006.01) |
| *G09F 13/04* | (2006.01) |
| *H10H 20/84* | (2025.01) |
| *H10H 20/01* | (2025.01) |

(52) U.S. Cl.
CPC ............. *H10H 20/84* (2025.01); *G09F 13/04* (2013.01); *G09F 13/0404* (2013.01); *G09F 13/08* (2013.01); *H10H 20/034* (2025.01)

(58) Field of Classification Search
CPC ....... G09F 13/08; G09F 13/04; G09F 13/0404
USPC .................................................. 40/539, 564
See application file for complete search history.

(56) References Cited

U.S. PATENT DOCUMENTS

| | | | | | |
|---|---|---|---|---|---|
| 5,736,233 | A | * | 4/1998 | Fye | G09F 13/08 |
| | | | | | 428/206 |
| 6,534,163 | B1 | * | 3/2003 | Takatsu | G09F 13/10 |
| | | | | | 156/240 |
| 6,871,434 | B2 | * | 3/2005 | Sunaga | B60K 35/60 |
| | | | | | 362/489 |
| 12,337,769 | B2 | * | 6/2025 | Zemmrich | B60K 35/20 |

(Continued)

FOREIGN PATENT DOCUMENTS

| | | | | | |
|---|---|---|---|---|---|
| DE | 102021122689 | A1 | * | 3/2023 | ....... B29C 45/14688 |
| GB | 1205358 | A | * | 9/1970 | ........... B29C 39/023 |

OTHER PUBLICATIONS

DE-102021122689-A1 English Translation (Year: 2023).*

*Primary Examiner* — Kyle R Grabowski
(74) *Attorney, Agent, or Firm* — Nath, Goldberg & Meyer; Jerald L. Meyer

(57) ABSTRACT

A display device includes: an exterior base material including a high translucent section configured to allow light to penetrate, and a low translucent section having a lower light transmittance; a first coating layer which is provided on a surface of the high translucent section and has a lower light transmittance than the high translucent section; a second coating layer which is provided on the surface of the high translucent section and has a higher light transmittance than the first coating layer; and a third coating layer which is provided on a surface of the exterior base material including the first coating layer and the second coating layer and has a lower light transmittance than the second coating layer. The third coating layer is configured such that the surface formed on the first coating layers and the second coating layers is flush with the remaining surface.

8 Claims, 4 Drawing Sheets

(56) References Cited

U.S. PATENT DOCUMENTS

| | | | |
|---|---|---|---|
| 2021/0252828 A1* | 8/2021 | Eitel | G09F 13/08 |
| 2023/0326378 A1* | 10/2023 | Hosokawa | B32B 3/266 |
| | | | 40/564 |

* cited by examiner

DISPLAY DEVICE AND METHOD OF MANUFACTURING DISPLAY DEVICE

CROSS REFERENCE TO RELATED APPLICATION

This application is based upon and claims the benefit of priority under 35 U.S.C. § 119 from Japanese Patent Application No. 2022-049814 filed on Mar. 25, 2022, the entire contents of which are incorporated herein by reference.

BACKGROUND

The present disclosure relates to a display device and a method of manufacturing the display device.

In recent years, a method has been employed to display information such as letters or designs on the exterior panels of various products, including electric appliances. Such products may require specifications such that nothing appears on the surface of an exterior panel if nothing is done, while a display is produced on the surface of the exterior panel in response to an operation such as power activation.

Japanese Unexamined Patent Application Publication No. 2015-9764 discloses a technique for making pictorial patterns of light appear on the surface of exterior resin components of an automobile. In addition, Japanese Unexamined Patent Application Publication No. 2021-149052 also discloses a technique for displaying letters on decorative panels.

SUMMARY

The above specifications can be realized by using software-based processing; however, there is a disadvantage that the specifications require the installation of a liquid crystal panel or the like, which increases the cost.

The first aspect of one or more embodiments provides a display device for producing a display appearing on a surface of an exterior panel of a product, and the device includes: an exterior base material including a high translucent section configured to allow light to penetrate and a low translucent section having a lower light transmittance than the high translucent section; a first coating layer which is provided in such a way as to exclude partial areas on a surface of the high translucent section and has a lower light transmittance than the high translucent section; a second coating layer which is provided in the partial areas on the surface the high translucent section and has a higher light transmittance than the first coating layer; and a third coating layer which is provided on a surface of the exterior base material including the first coating layer and the second coating layer and has a lower light transmittance than the second coating layer. The third coating layer is formed in such a way as to be flush with the surface of the exterior base material including the first coating layer and the second coating layer.

The second aspect of one or more embodiments provides a method of manufacturing a display device for producing a display appearing on a surface of an exterior panel of a product, and the method includes: with respect to an exterior base material including a high translucent section configured to allow light to penetrate and a low translucent section having a lower light transmittance than the high translucent section, forming a first coating layer, which has a lower light transmittance than the high translucent section, on a surface of the high translucent section in such a way as to exclude partial areas; forming a second coating layer, which has a higher light transmittance than the first coating layer, in the partial areas on the surface of the high translucent section; and forming a third coating layer, which has a lower light transmittance than the second coating layer, in such a way as to be flush with a surface of the exterior base material including the first coating layer and the second coating layer.

DETAILED DESCRIPTION

A display device 10 according to the present embodiment will be described below with reference to FIGS. 1 and 2. The display device 10 is a device for displaying predetermined information on the surface of an exterior panel 30 of a product. The product is, for example, an electric appliance that is portable and has a size enabling the electric appliance to be hung on a wall. The product may be a product other than an electric appliance or may be a vehicle interior component or a vehicle exterior component. As the information displayed by the display device 10, the letters "ABC" are illustrated in FIG. 1; however, the information is not limited to these letters, and may be other letters, figures, symbols, patterns or combinations thereof.

The display device 10 is mainly constituted of a light source 20 and an exterior panel 30.

Figure 1:
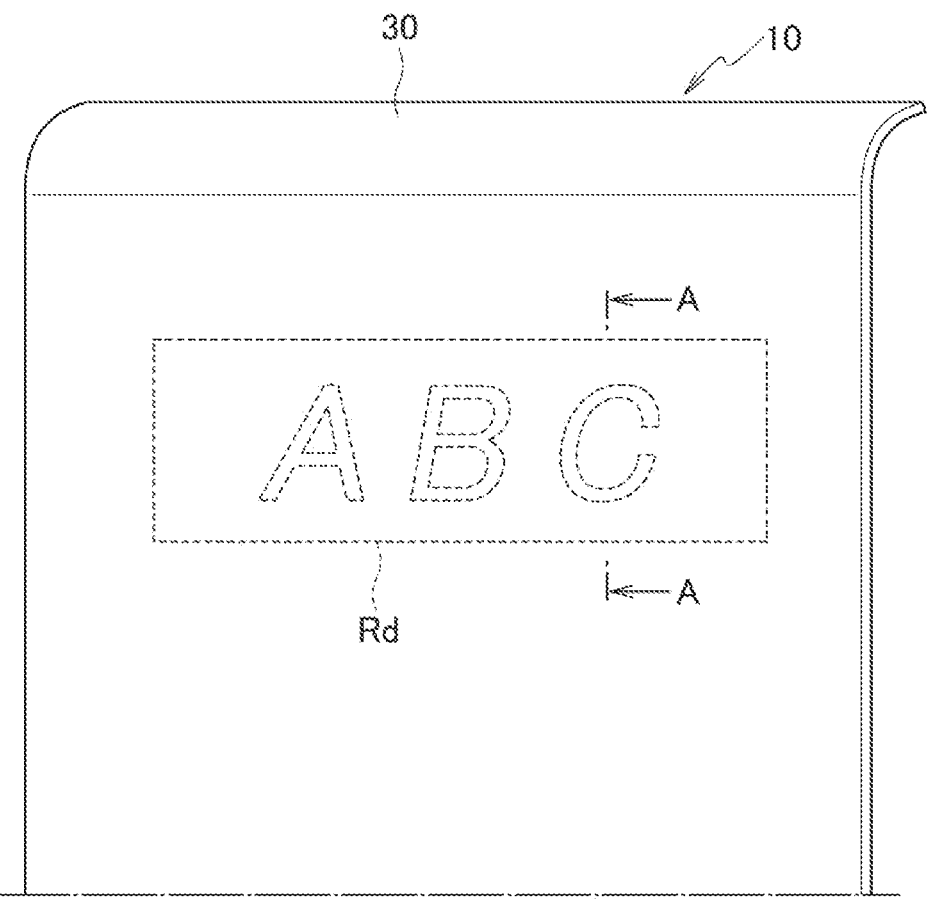
FIG. 1 illustrates the main part of a display device according to the present embodiment.

The light source 20 is arranged on the rear side of the exterior panel 30 and is attached to, for example, a product body 40 (not illustrated in FIG. 1). The light source 20 is arranged so as to face the rear surface of the exterior panel 30 at a certain distance from the exterior panel 30.

The light source 20 is a device that radiates light toward a required area of the exterior panel 30. The light source 20 includes a light-emitting element 21, a diffusing plate 22, and a shielding plate 23.

The light-emitting element 21 is an element which emits light, such as an LED (light-emitting diode).

The diffusion plate 22 is arranged so as to face the exterior panel 30. The diffusing plate 22 emits uniformly planar light which has been emitted from the light-emitting element 21.

The shielding plate 23 has a box shape with one end face open, and houses the light-emitting element 21 and the diffusion plate 22. The shielding plate 23 surrounds the light-emitting element 21 and the diffusion plate 22, and thereby restricts light from being diffused to the areas other than the required areas of the exterior panel 30.

The exterior panel 30 is a member covering the outer side of the product body and has a role in the design of the product. The exterior panel 30 is attached in an operable and closable manner to the product body 40 to facilitate maintenance work such as cleaning the product body 40.

The exterior panel 30 is constituted of an exterior base material 31, first coating layers 32, second coating layers 33, and a third coating layer 34.

The exterior base material 31 is a base material for forming the exterior panel 30. The exterior base material 31 is constituted of low translucent sections 31a and a high translucent section 31b. The low translucent sections 31a and the high translucent section 31b form part of the exterior base material 31, and when the exterior base material 31 is viewed along the surface, the area formed by the low translucent sections 31a is distinguished from the area formed by the high translucent section 31b. The low-translucent sections 31a and the high-translucent section 31b are integrally molded by two-color molding using resin materials.

The low translucent sections 31a form the main part of the exterior base material 31 and are formed to be colored opaque or colorless opaque. In this respect, as long as the light transmittance of the low translucent sections 31a is lower than that of the high translucent section 31b, the low translucent sections 31a are not limited to being colored opaque or colorless opaque. However, in order to suppress the transmission of unwanted light from the exterior panel 30, it is preferable that the low-translucent sections 31a have a configuration that does not allow light to penetrate, like colored opaque or colorless opaque.

The high-translucent section 31b forms a portion of the exterior base material 31 corresponding to a display range Rd (see FIG. 1). The display range Rd is set to include the letters "ABC" that is the information to be displayed, and the surroundings thereof. The high translucent section 31b is formed to be colored transparent or colorless transparent; however, the high translucent section 31b is not limited to this configuration as long as it is configured to allow light to penetrate.

The light source 20 described above is arranged in a position facing, the high-translucent section 31b so as to radiate light toward the high-translucent section 31b of the exterior panel 30. One light source 20 may be provided for one high-translucent section 31b, or a plurality of light sources 20 may be provided for one high-translucent section 31b.

In the present embodiment, one high-translucent section 31b is set in such a way as to include all the letters "ABC". However, three high-translucent sections 31b independent of each other may be provided to include the respective letters "A", "B", and "C".

The first coating layers 32 are provided on the surface of the high-translucent section 31b. The first coating layers 32 are not provided on the entire surface of the high-translucent section 31b, and are provided in such a way as to exclude partial areas on the surface thereof. The partial areas correspond to the shapes of the letters "ABC". The first coating layers 32 are configured to have a lower light transmittance than the high-translucent section 31b. For example, the first coating layers 32 are firmed using a paint having a color such as gray.

The second coating layers 33 are provided on the surface of the high-translucent section 31b, and the second coating layers 33 are provided in the areas where the first coating layers 32 are not provided. In other words, the second coating layers 33 are provided in the partial areas described above, that is, provided in such a way as to draw the shapes of the letters "ABC". The second coating layers 33 are configured to have a higher light transmittance than the first coating layer 32. For example, the second coating layers 33 are formed of a light-transmitting transparent urethane resin.

The contrast between the letters "ABC" displayed on the exterior panel 30 and the surroundings of the letters becomes strong as the difference in light transmittance between the first coating layers 32 and the second coating layers 33 increases. The respective light transmittances of the first coating layers 32 and the second coating layer 33 can be determined in consideration of the display mode.

The third coating layer 34 is provided on the surface of the exterior base material 31 including the first coating layers 32 and the second coating layers 33. The third coating layer 34 is configured such that the surface formed on the first coating layers 32 and the second coating layers 33 is flush with the remaining surface, that is, the surface formed on the low translucent sections 31a. Thus, the exterior panel 30 is uniformly firmed on the surface with no unevenness. A thickness to of the third coating layer 34 at the first coating layers 32 and the second coating layers 33 is less than a thickness tb of the third coating layer 34 at the low translucent sections 31a. The third coating layer 34 has a lower light transmittance than the second coating, layer 33. For example, the third coating layer 34 is formed using a color corresponding to the appearance of the product, for example, using a paint having a color such as milky white.

In order to protect the exterior panel 30, a coating layer may be further provided on the third coating layer 34.

Figure 3:
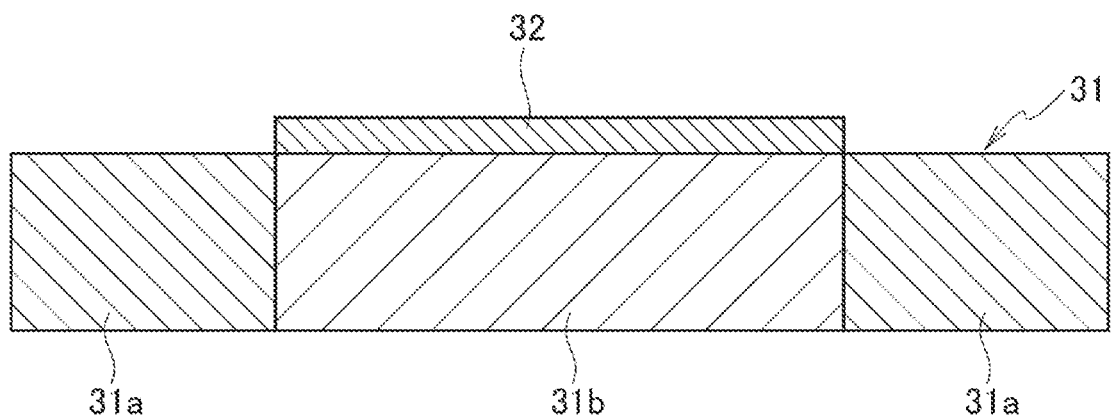
FIG. 3 illustrates a manufacturing process of the display device.

Next, the method of manufacturing the display device 10 will be described with reference to FIGS. 3 to 6. First, as illustrated in FIG. 3, the exterior base material 31 is prepared in which the low translucent sections 31a and the high-translucent section 31b are integrally molded by two-color molding. Thereafter, a paint having a color such as gray, which has a lower light transmittance than the high-translucent section 31b, is applied to the surface of the high-translucent section 31b. As a result, the first coating layer 32 is formed over the entire surface of the high-translucent section 31b.

Figure 4:
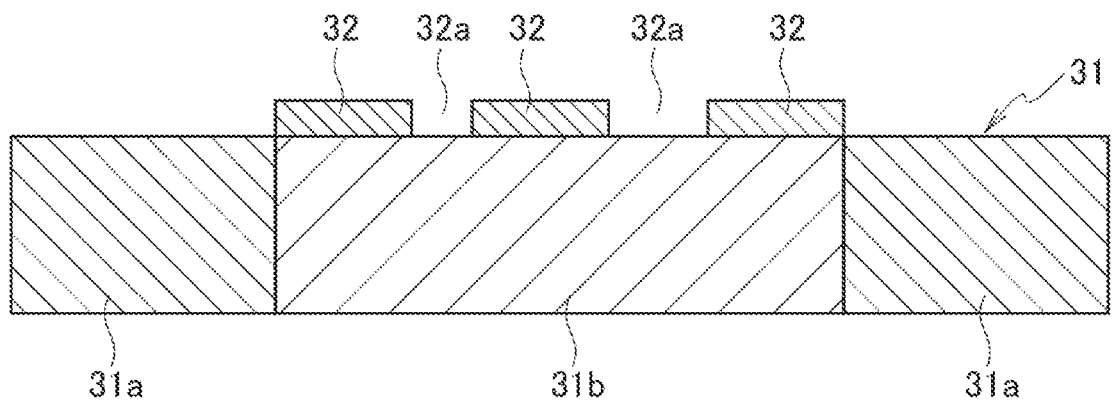
FIG. 4 illustrates the manufacturing process of the display device.

Next, as illustrated in FIG. 4, of the first coating layer 32 formed over the entire surface of the high-translucent section 31b, the first coating layer 32 present in the partial areas 32a is removed. The high-translucent section 31b is exposed in the partial areas 32a from which the first coating layer 32 has been removed. As described above, the partial areas 32a from which the first coating layer 32 has been removed correspond to the shapes of the letters "ABC".

Figure 5:
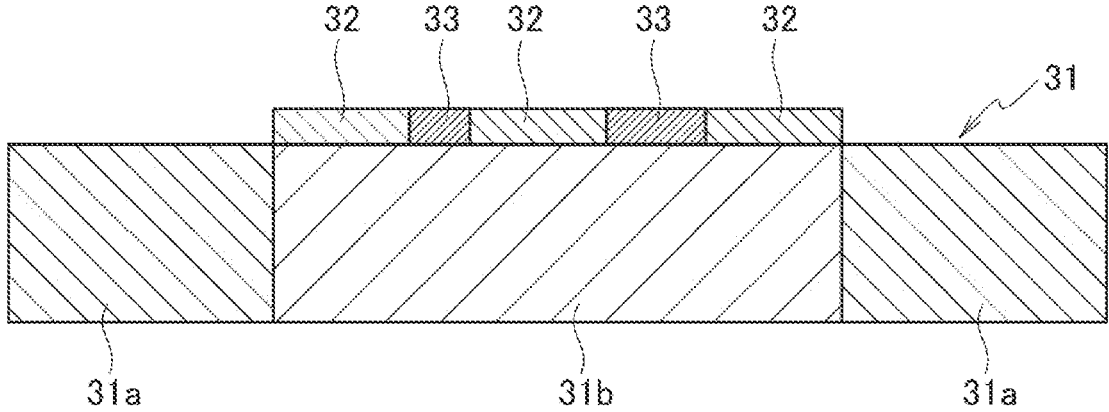
FIG. 5 illustrates the manufacturing process of the display device.

As illustrated in FIG. 5, a transparent urethane resin, which has a higher light transmittance than the first coating layers 32, is applied to the surface of the high-translucent section 31b including the first coating layers 32. The transparent urethane resin applied thereto enters the areas where the first coating layers 32 are not provided, thereby forming the second coating layers 33 on the surface of the high translucent section 31b. The transparent urethane resin is also applied to the surfaces of the first coating layers 32; however, since the transparent urethane resin applied thereto has a small thickness, it can be treated as substantially absent.

Figure 6:
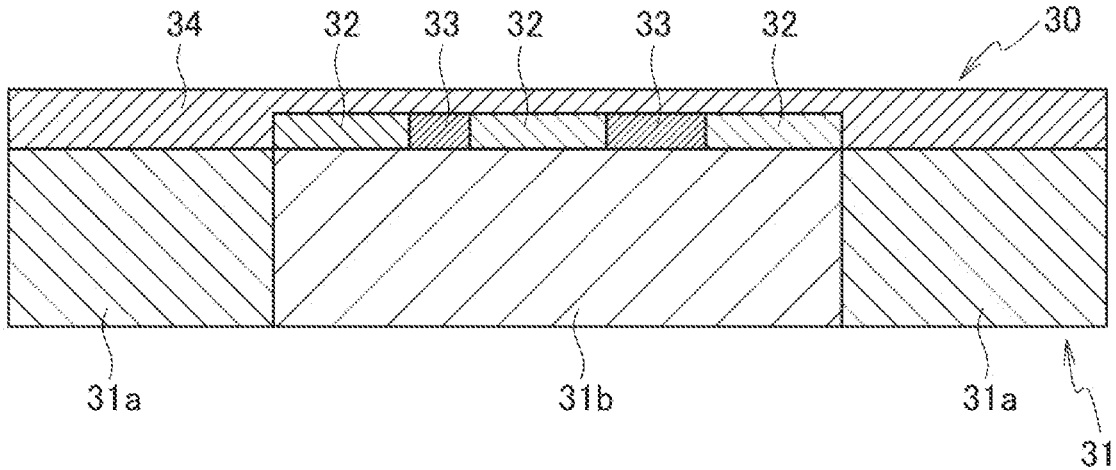
FIG. 6 illustrates the manufacturing process of the display device.

Next, as illustrated in FIG. 6, a paint having a color such as milky white, which has a lower light transmittance than the second coating layers 33, is applied to the surface of the exterior base material 31 including the first coating layers 32 and the second coating layers 33. Thus, the third coating layer 34 is formed on the surface of the exterior base material 31 including the first coating layers 32 and the second coating layers 33. In this case, the paint is applied such that the thickness to of the third coating layer 34 at the first coating layers 32 and the second coating layers 33 is greater than the thickness tb of the third coating layer 34 at the low translucent sections 31a As a result, the third coating layer 34 is generated such that the surface formed on the first coating layers 32 and the second coating layers 33 is flush with the remaining surface, that is, the surface formed on the low translucent sections 31*a*.

When the exterior panel 30 is manufactured through the above process, the exterior panel 30 is attached to the product body 40 so as to cover the outer side of the product body 40. At this time, the light source 20 is arranged in the product body 40 at a position facing the high-translucent section 31*b*. Thus, the display device 10 integrated with the exterior panel 30 is manufactured.

Figure 2:
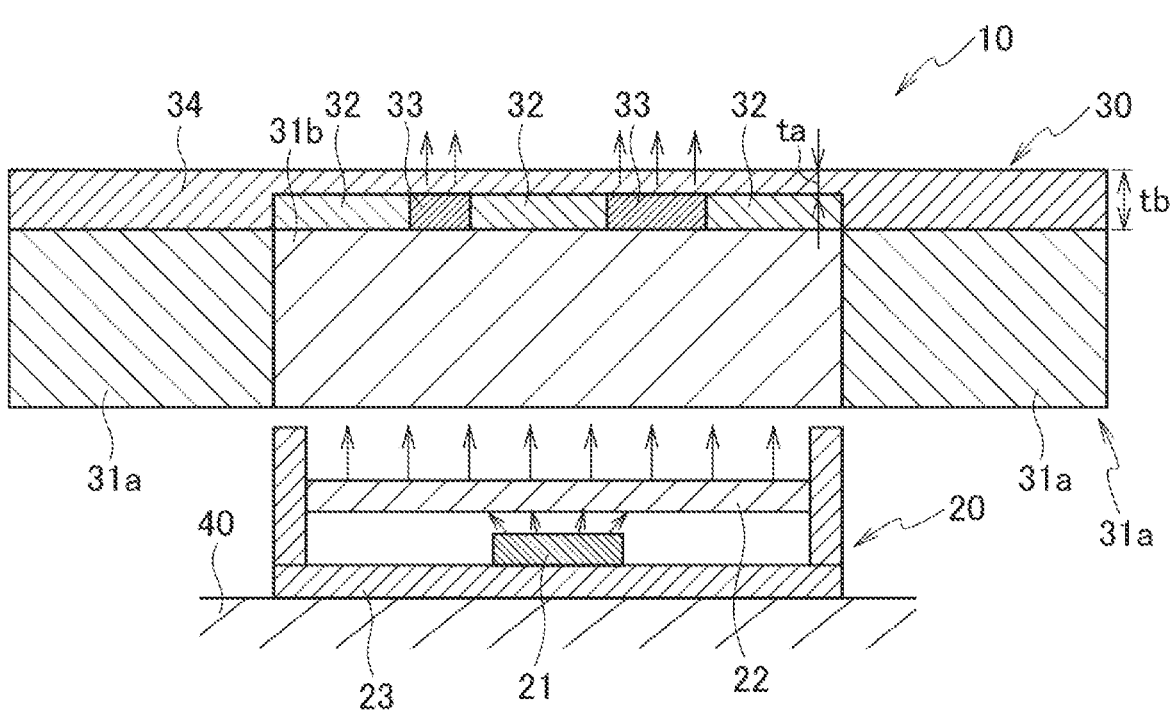
FIG. 2 illustrates a cross-sectional view taken along line A-A of FIG. 1.

According to the display device 10 of the present embodiment, as illustrated in FIG. 2, the light source 20 is turned on by turning on the power of the product or by performing a predetermined display-on operation after turning on the power of the product. The light emitted from the light-emitting element 21 is made uniform by the diffusion plate 22 and emitted as a planar light. In addition, the light-emitting element 21 and the diffusion plate 22 are surrounded by the box-shaped shielding plate 23. Thus, the light emitted from the light source 20 is radiated to the high-translucent section 31*b* of the exterior base material 31.

Some of the light which has penetrated the high translucent section 31*b* reaches the first coating layers 32. However, much of the above light cannot penetrate the first coating layers 32. In addition, even for the light which has penetrated the first coating layers 32, since the third coating layer 34 is present after the first coating layers 32, almost no light penetrates the third coating layer 34, and thus almost no light is emitted to the outer side of the exterior panel 30.

In addition, some of the light which has penetrated the high translucent section 31*b* reaches the second coating layers 33, and much of the above light which has reached the high translucent section 31*b* penetrates the second coating layers 33. Since the third coating layer 34 has a low light transmittance, some of the light which has penetrated the second coating layers 33 cannot penetrate the third coating layer 34. Meanwhile, since the thickness to of the third coating layer 34 is relatively small, some of the light which has penetrated the second coating layers 33 penetrates the third coating layer 34. As a result, the light which penetrates the third coating layer 34 and is entitled to the outer side of the exterior panel 30 is present.

When the light which has penetrated the third coating layer 34 reaches the eyes of the user who uses the product, the user can recognize the letters "ABC", which appear as if floating on the exterior panel 30 of the product. Meanwhile, the light source 20 is turned off by turning off the power of the product or by, performing a predetermined display-off operation while the power of the product is on. For this reason, no more light is emitted to the outer side of the exterior panel 30 as described above, and thus the user can no longer visually recognize the letters "ABC".

The third coating layer 34 is formed by a paint having a color such as milky white, which has a lower light transmittance than the second coating layers 33. For this reason, the user is not able to visually identify the structure behind the third coating layer 34, specifically, the second coating layers 33 forming the letters "ABC" and the first coating layers 32 forming the surroundings of the second coating layers 33. Thus, when the light source 20 is turned off, it is possible to prevent a state that it is possible to see through to the letters "ABC". In addition, when the light source 20 is turned on, the letters "ABC" appear abruptly on the surface of the exterior panel 30, which gives an impression that a balanced display can be made.

Thus, according to the display device 10 of the present embodiment, the specification can be realized with a simple configuration in which nothing appears on the surface of the exterior panel 30 unless the light source 20 is turned on, while the display is produced on the surface of the exterior panel 30 when the light source 20 is turned on. This makes it possible to produce a display according to product specifications along with achieving a cost reduction.

In the present embodiment, the light source 20 is arranged on the rear side of the exterior base material 31 at a certain distance from the exterior base material 31. This configuration makes it possible to suppress the transmission of an impact from the exterior base material 31 to the light source 20, and thus the light source 20, which is an electrical component, can be protected. When the exterior panel 30 opens and closes with respect to the product body 40, or when the product is accidentally dropped, although it is conceivable that an impact is applied to the exterior panel 30, the light source 20 can be protected from such an impact.

Further, in the present embodiment, the light source 20 includes the light-emitting element 21 which emits light, the diffusion plate 22 which is arranged so as to face the high translucent section 31*b*, and the shielding plate 23 which is arranged around the light-emitting element 21 and the diffusion plate 22. This configuration makes it possible for the light emitted from the light-emitting element 21 to be effectively radiated to the high translucent section 31*b* of the exterior panel 30.

The method of manufacturing the display device 10 according to the present embodiment makes it possible to provide the display device 10 having the above operation and effect.

In the above embodiment, after the first coating layer 32 is applied to the entire surface of the high translucent section 31*b*, the first coating layer 32 is partially removed. However, when the first coating layer 32 is applied to the surface of the high translucent section 31*b*, the first coating layer 32 may be applied so as to exclude the areas corresponding to the letters "ABC" (the partial areas). Further, in forming the respective coating layers, an alternative method such as printing may be used in addition to the coating method.

The above embodiment described in detail is not limited to the configuration described above, and may be a modified example to the extent that it does not deviate from the gist of the present disclosure.

What is claimed is:

1. A display device for producing a display appearing on a surface of an exterior panel of a product, the device comprising:
   an exterior base material including a high translucent section configured to allow light to penetrate and a low translucent section having a lower light transmittance than the high translucent section;
   a first coating layer which is provided in such a way as to exclude partial areas on a surface of the high translucent section and has a lower light transmittance than the high translucent section;
   a second coating layer which is provided in the partial areas on the surface of the high translucent section and has a higher light transmittance than the first coating layer; and
   a third coating layer which is provided on a surface of the exterior base material including the first coating layer and the second coating layer and has a lower light transmittance than the second coating layer; wherein
   the third coating layer is formed in such a way as to be a flush surface of the exterior base material including the first coating layer and the second coating layer such that the exterior panel has a uniform surface without unevenness, and the thickness of the third coating layer over the first and second coating layer differs from a thickness of the third coating layer at the low translucent section.

2. The display device according to claim 1, further comprising:

a light source which is arranged so as to face a rear surface of the exterior panel at a certain distance therefrom and radiates light toward the high translucent section.

3. The display device according to claim 2, wherein the light source includes:

a light-emitting element configured to emit light;

a diffusion plate which is arranged so as to face the high translucent section, and emits uniformly planar light which has been emitted from the light-emitting element; and a shielding plate which is arranged around the light-emitting element and the diffusion plate and restricts light from being diffused to the low translucent section.

4. A method of manufacturing a display device for producing a display appearing on a surface of an exterior panel of a product, the method comprising:

with respect to an exterior base material including a high translucent section configured to allow light to penetrate and a low translucent section having a lower light transmittance than the high translucent section;

forming a first coating layer, which has a lower light transmittance than the high translucent section, on a surface of the high translucent section in such a way as to exclude partial areas;

forming a second coating layer, which has a higher light transmittance than the first coating layer, in the partial areas on the surface of the high translucent section; and forming a third coating layer, which has a lower light transmittance than the second coating layer, in such a way as to be a flush surface of the exterior base material including the first coating layer and the second coating layer such that the exterior panel has a uniform surface without unevenness, and the thickness of the third coating layer over the first and second coating layer differs from a thickness of the third coating layer at the low translucent section.

5. The display device according to claim 1, further comprising:

a paint having a lower light transmittance than the second coating layer applied to the surface of the exterior base material.

6. The display device according to claim 1, wherein the thickness of the third coating layer over the first and second coating layers is less than a thickness of the third coating layer at the low translucent section.

7. The method according to claim 6, further comprising:

applying a paint having a lower light transmittance than the second coating layer to the surface of the exterior base material.

8. The method according to claim 6, wherein the thickness of the third coating layer over the first and second coating layers is less than a thickness of the third coating layer at the low translucent section.

* * * * *